(12) United States Patent
Schick et al.

(10) Patent No.: US 9,705,170 B2
(45) Date of Patent: Jul. 11, 2017

(54) SWITCHABLE BAND-PASS FILTER

(75) Inventors: Michael Schick, Weissach im Tal (DE); Norbert Kaste, Backnang (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 121 days.

(21) Appl. No.: 13/579,998

(22) PCT Filed: Jan. 19, 2011

(86) PCT No.: PCT/EP2011/000201
§ 371 (c)(1),
(2), (4) Date: Aug. 20, 2012

(87) PCT Pub. No.: WO2011/101075
PCT Pub. Date: Aug. 25, 2011

(65) Prior Publication Data
US 2012/0319803 A1   Dec. 20, 2012

(30) Foreign Application Priority Data

Feb. 18, 2010 (DE) .................. 10 2010 008 483

(51) Int. Cl.
*H01P 1/203* (2006.01)
*H01P 7/08* (2006.01)
*H01P 3/08* (2006.01)
*H03H 7/01* (2006.01)
*H03H 11/04* (2006.01)

(52) U.S. Cl.
CPC ........ *H01P 1/20345* (2013.01); *H01P 1/2039* (2013.01); *H01P 1/20336* (2013.01); *H01P 1/20381* (2013.01); *H01P 3/08* (2013.01); *H01P 7/088* (2013.01); *H03H 7/01* (2013.01); *H03H 7/1766* (2013.01); *H03H 11/04* (2013.01)

(58) Field of Classification Search
CPC ............. H01P 1/20336; H01P 1/20345; H01P 1/20381; H01P 1/2039; H01P 7/082; H01P 7/088; H01P 3/08
USPC ................ 333/204, 205, 219, 235, 238, 246
See application file for complete search history.

(56) References Cited

U.S. PATENT DOCUMENTS

| 4,672,337 A | 6/1987 | Thibeault |
| 5,361,050 A | 11/1994 | Einbinder |
| 7,471,166 B2 * | 12/2008 | Wei .......................... H01P 5/10 333/204 |

(Continued)

OTHER PUBLICATIONS

International Search Report for PCT Applicatoin No. PCT/EP2011/000201 dated May 18, 2011, pp. 1-7.

(Continued)

*Primary Examiner* — Stephen E Jones
*Assistant Examiner* — Rakesh Patel
(74) *Attorney, Agent, or Firm* — Ditthavong & Steiner, P.C.

(57) ABSTRACT

The invention relates to a switchable band-pass filter. In particular, the invention relates to a narrowband switchable band-pass filter over a broad frequency band with two filter elements (including microstripline technology, suitable for use as a cosite filter with a compact structure, which is particularly suitable for efficient mass production and robust in operation. The two filter elements in this context are coupled to one another, on the one hand via a switchable coupling device and, on the other hand, via a direct electromagnetic interaction.

9 Claims, 8 Drawing Sheets

(56) References Cited

U.S. PATENT DOCUMENTS

| | | | |
|---|---|---|---|
| 2003/0042992 A1 | 3/2003 | Frank | |
| 2003/0222732 A1* | 12/2003 | Matthaei | 333/99 S |
| 2006/0192640 A1* | 8/2006 | Tsiliaoukas | H03H 7/0123 333/205 |
| 2006/0273870 A1* | 12/2006 | Yeung et al. | 333/204 |
| 2009/0152739 A1* | 6/2009 | Rofougaran et al. | 257/778 |
| 2010/0283557 A1* | 11/2010 | Taniguchi | 333/204 |
| 2014/0035703 A1* | 2/2014 | Ma | H01P 1/20336 333/204 |

OTHER PUBLICATIONS

Kolodnyak, D.V. et al., Bandpass Filters for Ka-Band Satellite Communication Applications Based on LTCC, journal, Oct. 2008, pp. 211-214, Amsterdam, The Netherlands.

\* cited by examiner

SWITCHABLE BAND-PASS FILTER

CROSS-REFERENCE TO RELATED APPLICATION

The present application is a national phase application of PCT Application No. PCT/EP2011/000201, filed on Jan. 19, 2011, and claims priority to German Patent Application No. DE 10 2010 008 483.2, filed on Feb. 18, 2010, the entire contents of which are herein incorporated by reference.

BACKGROUND OF THE INVENTION

Field of the Invention

The invention relates to a switchable band-pass filter. In particular, the invention relates to a narrowband band-pass filter switchable over a broad frequency band with two filter elements comprising microstripline technology, suitable for use as a so-called cosite filter with a compact structure which is particularly suitable for mass production and robust in operation.

Discussion of the Background

Frequency-hopping methods are used to an increasing extent in radio communications technology. Accordingly, the carrier frequency of the transmission link alternates in a rapid sequence known to the transmitter and receiver. For the transmitters and receivers used, the demand for narrowband filters which are adjustable in frequency over the relevant frequency ranges is derived from this. These filters must achieve a rapid adjustability of the mid-frequency and, if possible, a digital switching with a fine frequency resolution derived from the application.

Moreover, mobile communications devices provide transmission and reception component groups in close proximity. In addition to this, a plurality of communications devices is often active in the environment within the same frequency band at the same time. Accordingly, it is advantageous if the same filter can be used as a reception filter for selecting the desired reception signal and filtering out interference acting via the reception antenna, and also as a transmission filter for reducing undesirable radiation. Such a filter is referred to as a cosite filter and must be additionally capable of transmitting a corresponding transmission power with low insertion loss and, on the one hand, filtering signals in the forward direction from amplifier to antenna and, on the other hand, in the return direction from antenna to receiver.

The prior art is the realization of such filters as double-circuit resonator filters comprising two high-quality resonators coupled via a network of capacitors and/or inductances. The frequency tuning is implemented via connectable capacitors by means of semiconductor diodes. In this context, the resonators are generally high-quality coil resonators (especially air coils). The frequency adjustment is implemented by means of PIN diodes of connectable capacitors. The combination of the high-quality coil resonators and the use of PIN diodes allows the transmission of correspondingly high transmission powers.

However, the structure described provides a series of disadvantages. The use of two coil resonators leads to large mechanical dimensions, heavy mass, corresponding disadvantages in the robustness of the filter with regard to vibration stress, and large dimensions of the filter component group as a whole. A filter component group realized on this technical basis leads to correspondingly unfavourable requirements for integration in mobile devices. Moreover, a band-pass filter with two coil resonators is associated with further disadvantages during manufacture, calibration and operation. On the one hand, a corresponding filter structure for automated manufacture in production lines designed for surface-mounted components (English: surface mounted devices, abbreviation: SMD) and re-flow soldering methods (English: reflow soldering) is not possible in a fully automated manner, but also requires manual manufacturing steps. Additionally, both coil resonators must be matched exactly with one another in a difficult calibration step, in order to achieve a corresponding, constantly flat filter transmission function within the passband. A tuneable band-pass filter realized in this manner is cost intensive to manufacture and structured in a complex manner.

SUMMARY OF THE INVENTION

The invention advantageously a narrowband band-pass filter switchable over a broad frequency band for the UHF/VHF range, which avoids the named disadvantages of the prior art.

The switchable band-pass filter includes a first filter element and a second filter element which are connected to one another via a switchable coupling device. The band-pass filter is characterised in that the first and the second filter element comprise conductor structures formed in each case in a flat plane, and the first and the second filter element each comprise at least two line portions. In addition to the coupling via the switchable coupling device for the realization of the switchable band-pass filter, the first and the second filter element are disposed in electromagnetic interaction with one another.

This direct interaction of the first and second filter element ensures a small structural size of the overall band-pass filter and is achieved through the absence of further conductor elements, possibly connected to earth, between the first and the second filter element. The first and the second filter element are therefore structured directly adjacent to one another although at a distance. The realization of the first and the second filter element in the form of double-circuit resonator filters comprising microstripline technology allows the band-pass filter to be structured using multi-layer printed-circuit board technology and is therefore efficient and can be manufactured at low cost. In this context, the microstriplines are shorted at one end. The small overall mass of the band-pass filter and the distribution of the masses in the band-pass filter according to the invention are particularly suited for use in mobile communications devices. Similarly, the structure comprising microstripline technology allows a low-temperature coefficient without special temperature compensation or adjustment of the filter during operation over a wide temperature range from −30° C. to +80° C.

In particular, it is advantageous if the coupling device is realized as a network formed from capacitors and/or inductances and semiconductor diodes. In particular, PIN diodes are suitable for semiconductor diodes to be used as switch elements for the transmission of relatively high powers, however, varactor diodes can also be used with relatively low powers.

A space-saving realization of the band-pass filter on multi-layer printed-circuit boards is particularly preferred, wherein the first and the second filter element can be applied using microstripline technology to one or more layers of the printed-circuit board, and the coupling device is realized on one or more layers. The band-pass filter can also be structured in an appropriate manner so that the input connection of the band-pass filter is formed on an appropriately shaped portion of the first filter element, and the output connection is formed on an appropriately shaped portion of the second filter element. Moreover, in a preferred embodiment of the band-pass filter according to the invention, the coupling network can be formed in such a manner that the capacitors connectable to the first and second filter element are identical in size. This means that the filter can advantageously be operated with identical properties in the forward direction (transmission filter) and in the return direction (reception filter). This presupposes that the first and second filter elements are structured in a symmetrical manner relative to one another. The identity of the resonators can be guaranteed through the use of stripline technology.

The band-pass filter therefore provides a mutually symmetrical behaviour at the input and the output.

If the band-pass filter is realized in the form of line portions, it is favourable to guide the line portions of the first and the second filter element in such a manner relative to one another that, on the one hand, line portions are disposed parallel to one another in order to achieve a direct coupling between the first and the second filter element in parallel portions, and, furthermore, to keep the space requirement for the filter elements and the band-pass filter as a whole as small as possible.

In a further, particularly appropriate embodiment of the band-pass filter, the first and the second filter elements comprise mutually parallel line portions, which are arranged in alternation and connected to one another at one end in a conductive manner. It is particularly advantageous if the first and the second filter element are each connected to at least one further line portion, which is formed for the tuning of the respective filter element. Accordingly, an exact calibration of the first and second filter element with reference to their filter mid-frequency is therefore possible in a simple manner, if required. Optimum flatness of the filter transmission function within the passband can be achieved in this manner. A structure of the parallel line portions of the first filter element, on the one hand, and of the second filter element, on the other hand, on different layers of the printed-circuit board is particularly favourable in order to achieve a small space requirement of the band-pass filter and the direct electromagnetic interaction between the first filter element and the second filter element.

BRIEF DESCRIPTION OF THE DRAWINGS

The band-pass filter according to the invention is explained in greater detail below with reference to the drawings. The drawings are as follows.

DETAILED DESCRIPTION OF EXEMPLARY EMBODIMENTS OF THE INVENTION

Figure 1:
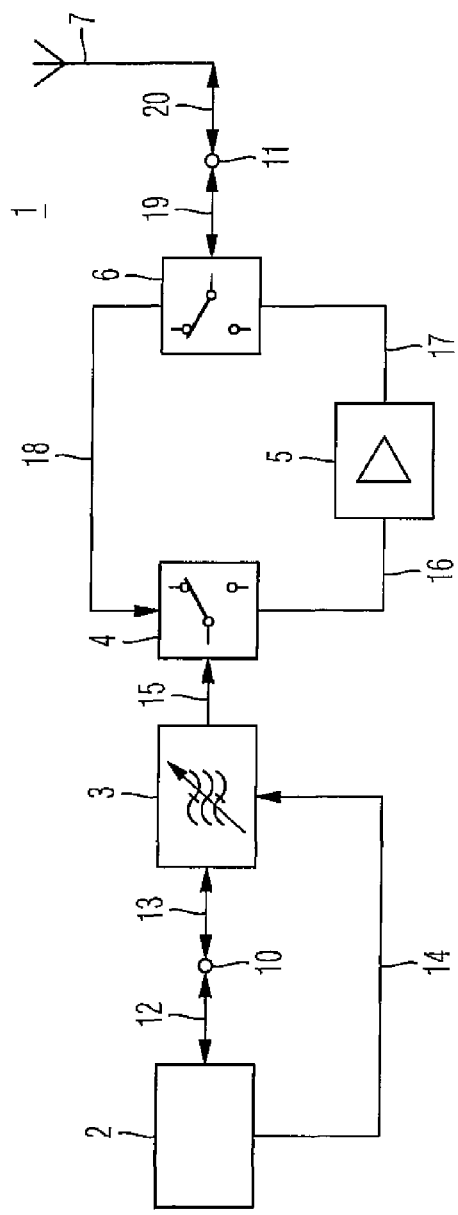
FIG. 1 shows a block-circuit diagram of the high-frequency part of a communications system with frequency-hopping using a band-pass filter according to the invention.

Before focusing on the structure of the switchable band-pass filter according to the invention, an appropriate application for the filter in a communications device 1 will first be described with reference to FIG. 1. A transceiver 2 is connected via a switchable band-pass filter 3 to an antenna 7. The mid-frequency for the signal 13, 15 to be transmitted or to be received is specified to the switchable band-pass filter 3 via a digital signal 14. The band-pass filter 3 is contained both in the transmission path 12, 13, 15, 16, 17, 19, 20 and also in the reception path 20, 19, 18, 15, 13, 12 of the communications device. Within the transmission path, a power amplifier 5 is additionally connected into the transmission signal path via the switches 4, 6 (realizable, for example, by circulators 4, 6). If the transceiver 2 is operated in frequency-hopping mode (English: frequency hopping), the mid-frequency of the band-pass filter, switched via the digital signal 14 from the transceiver 2, for the transmission or reception frequency to be set, must follow sufficiently rapidly and with high precision. At the same time, the band-pass filter 3 must provide a good matching to the inputs and outputs for this application. In one embodiment of the filter 3, values for the reflection factor at the input $S_{11}$ and at the output $S_{22}$ of less than −15 dB must be required for the matching. This corresponds to a standing wave ratio (VSWR: Voltage Standing Wave Ratio) less than 1.4. In the named embodiment, the band-pass filter 3 should provide the smallest possible insertion loss with good linearity of the filter transmission function over a broad power range, because both the transmission signal and also the reception signal are transmitted via the switchable band-pass filter 3. For a characteristic exemplary embodiment, an insertion loss (insertion loss) of less than 4 dB should be aimed at. Moreover, an operation within the specified values for a wide temperature range from −30° C. to +80° C. is meaningful for mobile communications devices 2. This requirement must therefore also be fulfilled by sub-component groups such as the switchable band-pass filter 3 according to the invention.

If the switchable band-pass filter 3 is operated as a so-called cosite filter for frequencies in the UHF band (Ultra High Frequency band), a frequency resolution of 8 bits is required in one embodiment for a switchable frequency bandwidth from 225 MHz to 400 MHz. If the switchable band-pass filter 3 is operated as a filter for frequencies in the VHF band (Very High Frequency band), a frequency resolution of 9 bits is required in one embodiment for a switchable frequency bandwidth from 30 MHz to 88 MHz.

Figure 2:
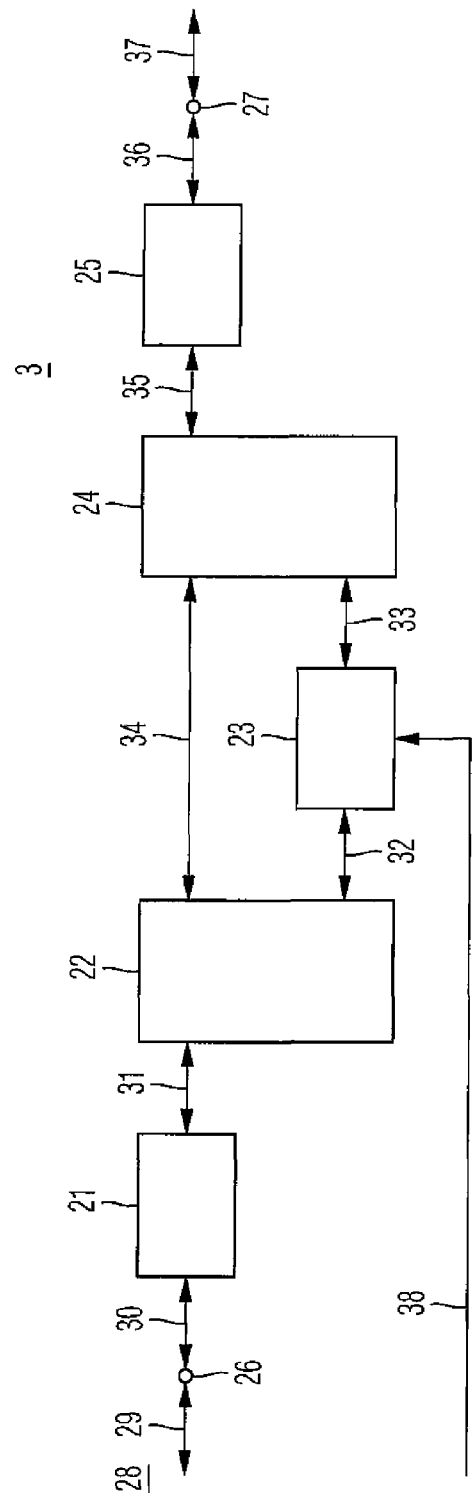
FIG. 2 shows a simplified structure of a band-pass filter according to the present invention tuneable over a broad frequency range.

FIG. 2 shows the structure of a preferred embodiment of the switchable band-pass filter 3 according to the present invention in a signal-flow diagram. The switchable band-pass filter 3 is structured in a symmetrical manner, that is to say, the band-pass filter 3 can be operated with a first connection 26 as the input and a second connection 27 as the output, or the band-pass filter can be operated with the second connection as the input and the first connection 26 as the output. The illustrated band-pass filter 3 shows broadband matching networks 21, 25 at the connections 26, 27 for matching to the line surge impedance, typically 50 ohms, of the signal lines 28, 37. The band-pass filter 3 in this embodiment provides a first filter element 22 and a second filter element 24. These filter elements 22, 24 can be realized in the form of double-circuit resonator filters. The filter elements 22, 24 are coupled to one another, on the one hand, via a coupling device 23. On the other hand, the two filter elements 22, 24 are additionally disposed in direct electromagnetic interaction 34 with one another. The adjustment of the filter mid-frequency is implemented via a digital switching signal 38. The direct coupling 34 of the first filter element 22 and the second filter element 24 in addition to the coupling 32, 33 via a coupling element 23 leads to a reduced structural size of the switchable band-pass filter 3 according to the invention, because a space-consuming and at the same time cost-intensive shielding between the first filter element 22 and the second filter element 24 can be dispensed with as a result of the targeted coupling.

Figure 3:
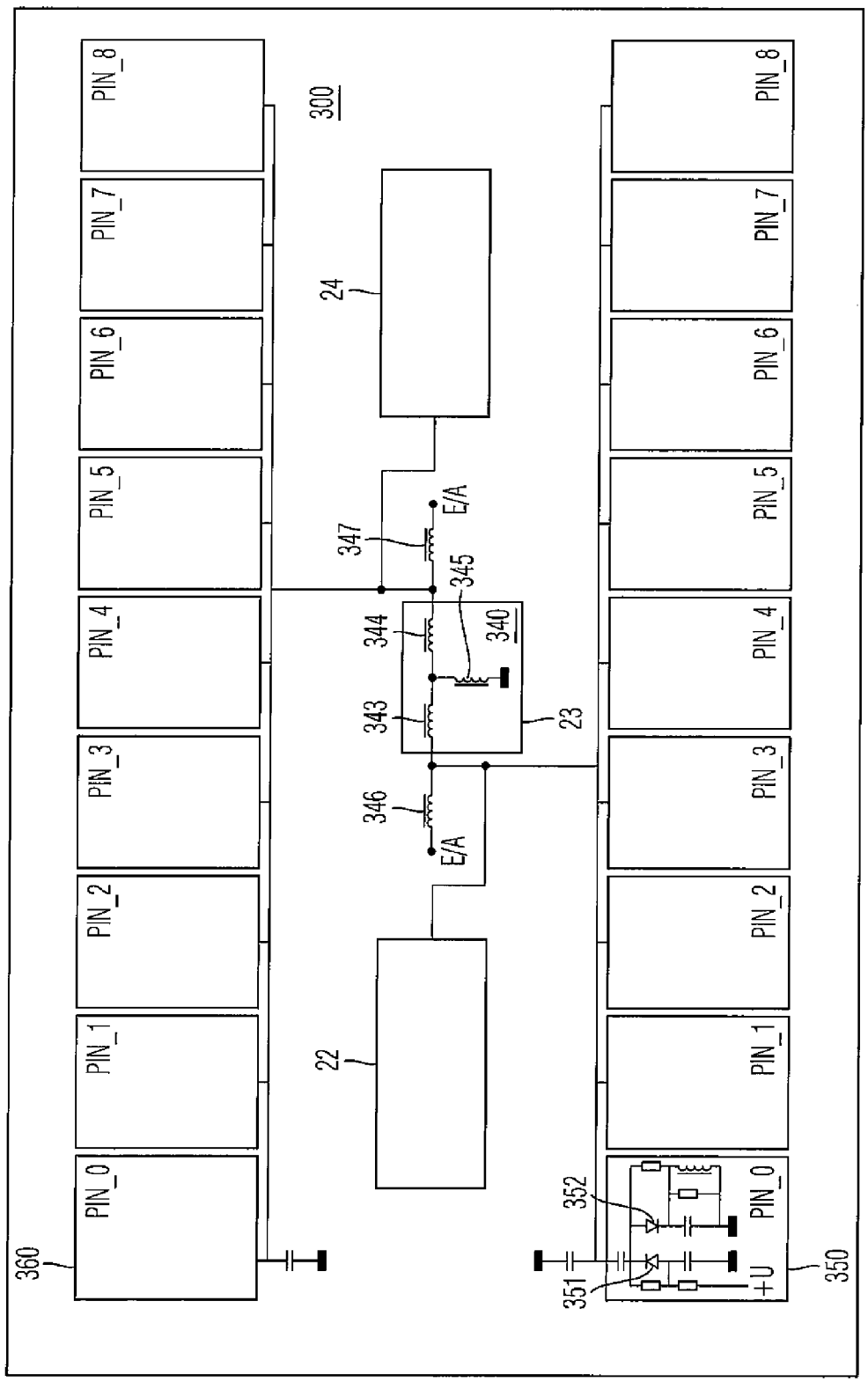
FIG. 3 shows a simple block-circuit diagram for a band-pass filter according to the invention for the VHF range.
Figure 4:
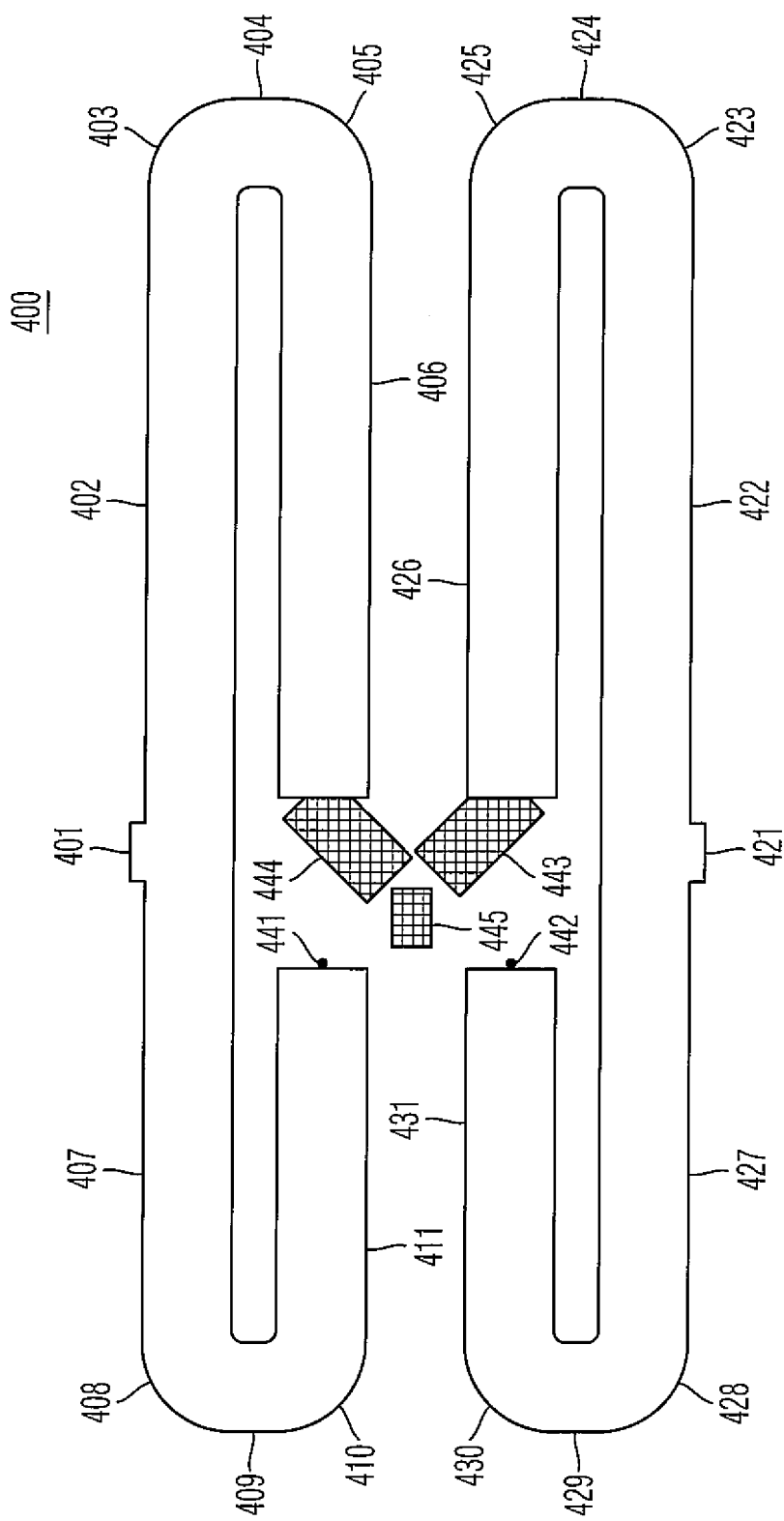
FIG. 4 shows the structure and the arrangement according to the invention of the resonators for a band-pass filter for the VHF range.

FIG. 3 and FIG. 4 illustrate an exemplary embodiment of the switchable band-pass filter 3 for frequencies in the VHF range from 30 MHz to 88 MHz and a frequency resolution of approximately 116 kHz with 9 bits. The first filter element 22 and the second filter element 24 are realized as TEM resonators (Transversal Electro-Magnetic wave) using microstripline technology. The first filter element 22 comprises four coupled microstripline portions 402, 406, 407, 411. In the same manner, the second filter element comprises four further coupled microstripline portions 422, 426, 427, 431. The first filter element 22 and the second filter element 24 are arranged symmetrically to one another and disposed in the same plane, that is to say, on the same surfaces of a printed-circuit board. In addition to the existing direct coupling, the coupling between the first filter element 22 and the second filter element 24 is fine tuned via a coupling device in the form of a T-element, with the inductances 443, 444, 445 as an inductive current coupling. The frequency tuning capacitor network of the coupling device 23 is connected by means of PIN diodes at the high point of each of the two resonators as the first and respectively the second filter element 22, 24.

FIG. 3 illustrates the structure of the frequency-determining capacitor network 300 determining the switchable mid-frequency of the band-pass filter 3 switched via PIN diodes. The capacitor network 300 is structured symmetrically for the first filter element 22 and the second filter element 24. The inputs and outputs of the band-pass filter marked with E/A are connected via matching-elements 346 and respectively 347 to the coupling device 23. The matching-elements 346, 347 can comprise a coil or any alternative reactance circuits, as illustrated. Dependent upon the value of the digital switching signal 38, the capacitor network is connected symmetrically and in part to the first filter element 22 and the second filter element 24. Moreover, the coupling device provides a T-element 340 comprising inductances 343, 344, 345 for the precise adjustment of the coupling as an inductive current coupling of the first filter element 22 and the second filter element 24. A switching network 350 for the connection of capacitors is specified for the PIN diodes 351, 352. If the digital signal 38 provides the value PIN_0="ON", an additional capacitor is connected via this switching network 350 to the first filter element 22 and, symmetrically to this, a capacitor is connected via the switching network 360 to the second filter element 24. The mid-frequency of the switchable, narrowband band-pass filter 3 is varied by connecting capacitors through the switching networks 350, 360. Appropriate control circuits, which are, however, per se known and have therefore not been explained in greater detail here or illustrated in FIG. 3, should be additionally provided in order to control the PIN diodes of the illustrated exemplary embodiment.

FIG. 4 shows the structure and the arrangement according to the invention of the resonators of the switchable VHF band-pass filter 3. As the first filter element 22, the first resonator comprises a first microstripline portion 402 and a second microstripline portion 407, which are disposed in a line, and a first connection of the switchable band-pass filter 3 is disposed at their connection point 401, at which the first and the second microstripline portion 402, 407 merge into one another. A first and respectively a second quarter-circle arc 403, followed by a short straight-line portion 404 and respectively 409, are connected at the end of the microstripline portions 402, 407 disposed opposite to the connecting point 401. The distance between the parallel-running microstripline portions 402/406, 407/411 is adjusted by means of the straight-line portions 404, 409. This is followed in each case by a third and respectively a fourth quarter-circle arc 405 and respectively 410. The third and respectively fourth quarter-circle arc 405, 410 are followed in each case by the third and fourth microstripline portion 406 and 411, wherein the fourth microstripline portion 411 is connected to earth via a through contact 441 at its end facing away from the fourth quarter-circle arc 410. The third microstripline portion 406 and the fourth microstripline portion 411 in the illustrated exemplary embodiment are disposed on a common straight line.

The second filter element 24 is structured in a symmetrical manner relative to the first filter element.

The second filter element comprises a fifth microstripline portion 422 and a sixth microstripline portion 427, which are disposed one after the other in a line. A second connection of the switchable band-pass filter 3 is disposed at their connecting point 421. A fifth and respectively a sixth quarter-circle arc 423 and 428, followed by a short straight-line portion 424 and respectively 429, are connected at the end disposed opposite to the connecting point 421. As in the case of the first filter element 22, the straight-line portions 424, 429 specify the distance between the parallel microstripline portions 422/426 and 427/431. These are followed in each case by a seventh and respectively an eighth quarter-circle arc 425 and respectively 430. The seventh and respectively eighth quarter-circle arc 425, 430 are followed by a seventh and eighth microstripline portion 426 and 431, wherein the eighth microstripline portion 431 is connected to earth at its end facing away from the other quarter-circle arc via a through contact 442. The seventh microstripline portion 426 and the eighth microstripline portion 431 in the illustrated exemplary embodiment are disposed on a common straight line. In this context, the two filter elements 22, 24 are arranged in such a manner that the microstripline portions 406, 411 on one side and 426, 431 on the other side, disposed in each case on a straight line, are arranged parallel and adjacent to one another. Accordingly, a direct electromagnetic coupling between the first and the second filter element 22, 24 is achieved via the microstriplines 406, 411, 426, 431. The microstripline portions 406 and 426 and respectively 411 and 431 are directly adjacent, that is to say, no elements, especially no screening, is disposed between the microstripline portions over their entire respective longitudinal extension. Moreover, the coupling between the first filter element 22 and the second filter element 24 is finely adjusted via a T-element with the inductances 443, 444, 445 as an inductive current coupling. This T-element is arranged between the third microstripline portion 406 of the first filter element 22 and the third microstripline portion 426 of the second filter element 24.

The arrangement of the microstripline portions 406, 411 on the one side and directly adjacent on the other side 426, 431 to form a direct electromagnetic coupling allows a corresponding structure with optimised structural-space of the switchable band-pass filter 3 according to the invention. Any screening between the adjacent microstriplines of the filter elements 22, 24 is explicitly dispensed with. Additionally, the structure of the switchable band-pass filter 3 for the VHF range in the illustrated exemplary embodiment achieves good mechanical stability as a result of the structure using microstripline technology by comparison with a realization of the resonators for the first and the second filter elements 22, 24 in the form of air coils. The symmetry of the structure ensures a substantial simplification of the calibration of the two filter elements. On the printed-circuit board for the band-pass filter, the microstriplines for the resonator structure of the two filter elements 22, 24 is applied on one side (B-side), and the coupling element 23 with the capacitor/PIN diode network is applied to the other side (L-side). As a substrate for the printed-circuit board, a multi-layered printed-circuit board (for example, manufactured by Rogers, 10-layer $\epsilon_r$=3.66) can be used. The components of the capacitor/PIN diode network can be fitted automatically (SMD-technology, surface-mounted device) and soldered using re-flow soldering methods. Manufacture and calibration of the band-pass filter 3 according to the invention are designed to be particularly efficient and cost-favourable. The entire volume for this embodiment of the band-pass filter according to the invention for the VHF range, including housing can accordingly be limited to less than 13 cm×7 cm×3 cm. The illustrated switchable VHF band-pass filter 3 can therefore be simply integrated into existing device designs. This is achieved through the selected design of the filter elements 22, 24 and the direct electromagnetic coupling of the filter elements 22, 24 according to the invention.

Figure 5:
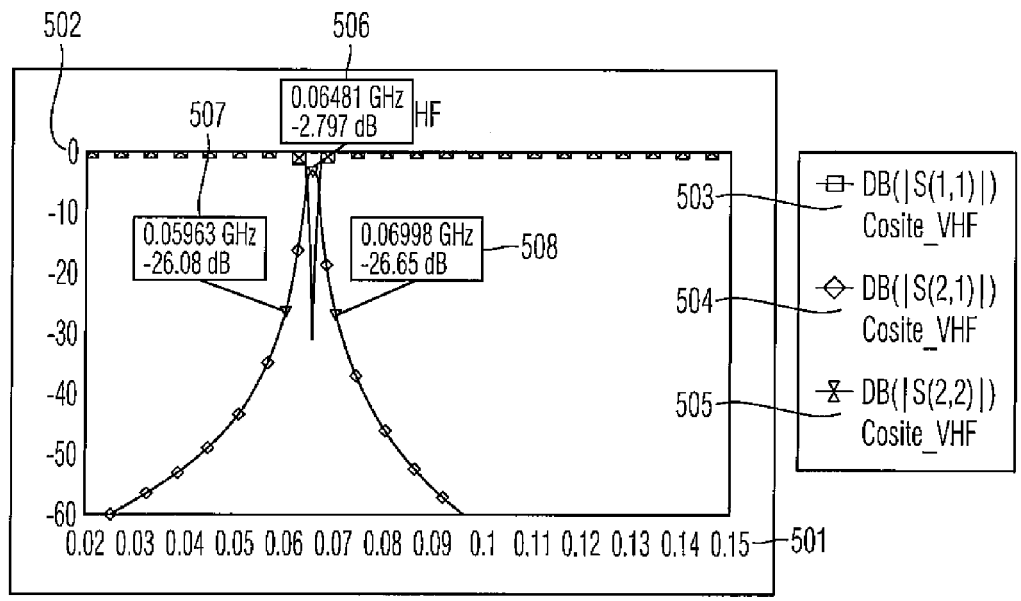
FIG. 5 shows simulated S-parameters for a band-pass filter according to the invention for the VHF range for a deviation of the mid-frequency $f_{ctr}$=+/−8%, and PIN_0, PIN_1, PIN_2, PIN_3, PIN_4 and PIN_5 at "ON"

FIG. 5 shows a simulation of the scattering parameters (abbreviated as S-parameters) of the switchable VHF band-pass filter 3 according to FIG. 3 and FIG. 4 for a digital switching signal 38 with the settings PIN_0, PIN_1, PIN_2, PIN_3, PIN_4, PIN_5 at "ON". On the horizontal axis 501, the frequency is plotted in GHz. On the vertical axis 502, the values for the scattering parameters are plotted in dB. The curve 503 represents the input-end matching of the switchable band-pass filter 3 in the form of the value of the input reflection factor $|S_{11}|$. The curve 505 represents the output-end matching of the switchable band-pass filter 3 in the form of the value of the output reflection factor $|S_{22}|$. The switchable band-pass filter 3 is matched for a mid-frequency $f_{ctr}$ of 0.0641 GHz with values for $|S_{11}|$ and $|S_{22}|$ less than −30 dB. The selectivity of the switchable band-pass filter 3 is shown for the illustrated mid-frequency $f_{ctr}$ and for frequencies which deviate from $f_{ctr}$ by 8%. For a frequency $f_{ctr}$=0.06481 GHz, the value for the filter transmission function 506 and accordingly the insertion loss $|S_{21}|$=−2.797 dB. The loss of the band-pass filter 3 for a frequency of 0.05963 GHz is −26.06 dB 507, and for a frequency of 0.06996 GHz is −26.65 dB 508.

Figure 6:
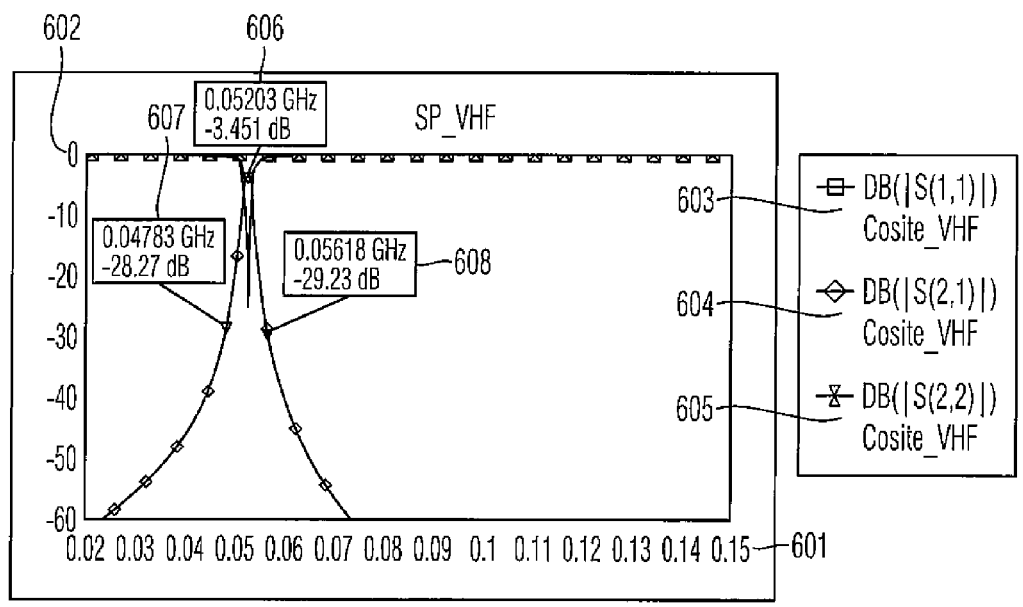
FIG. 6 shows simulated S-parameters for a band-pass filter according to the invention for the VHF range for a mid-frequency modified relative to FIG. 5 with a modified setting of the PIN diodes.

FIG. 6 shows a simulation of the scattering parameters (abbreviated as S-parameters) of the switchable VHF band-pass filter 3 according to FIG. 3 and FIG. 4 for a digital switching signal 38 with settings of the PIN diodes modified by comparison with FIG. 5. The frequency is plotted on the horizontal axis 601 in GHz. On the vertical axis 602, the values of the scattering parameter are plotted in dB. The curve 603 represents the input-end matching of the switchable band-pass filter 3 in the form of the value of the input reflection factor $|S_{11}|$. The curve 605 represents the output-end matching of the switchable band-pass filter 3 in the form of the value of the output reflection factor $|S_{22}|$. The switchable band-pass filter 3 is matched for a mid-frequency $f_{ctr}$ of 0.05203 GHz with values for $|S_{11}|$ and $|S_{22}|$ less than −20 dB. The selectivity of the switchable band-pass filter 3 is shown for the illustrated mid-frequency $f_{ctr}$ and for frequencies which deviate from $f_{ctr}$ by 8%. For a frequency $f_{ctr}$=0.05203 GHz, the value of the filter transmission function 606 and accordingly the insertion loss $|S_{21}|$=−3.451 dB. The loss of the band-pass filter 3 for a frequency of 0.04783 GHz is −28.27 dB (display 607) and for a frequency of 0.05618 GHz is −29.23 dB (display 608).

Figure 7:
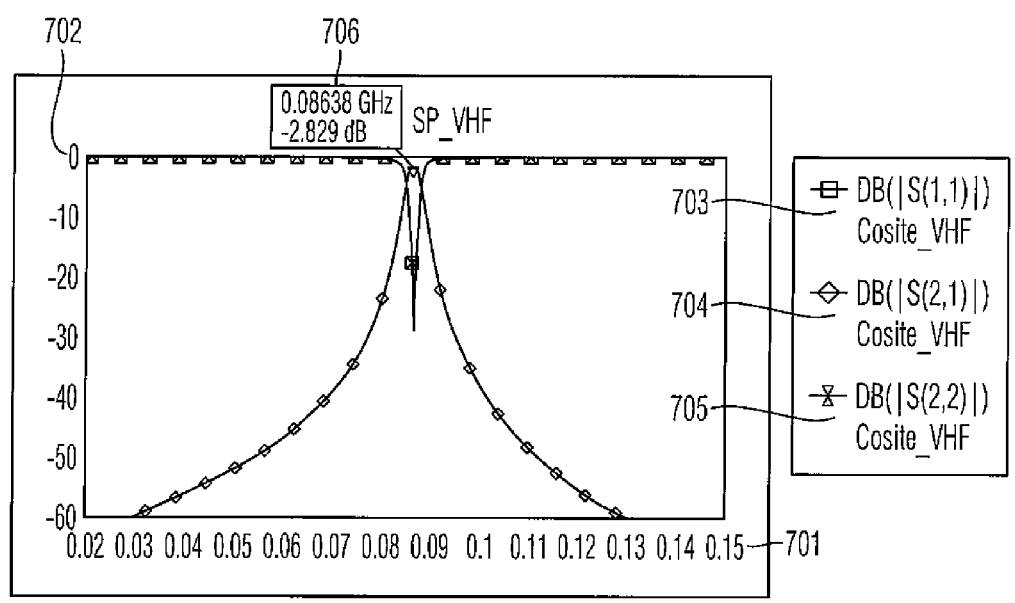
FIG. 7 shows simulated S-parameters for a band-pass filter according to the invention for the VHF range for a deviation from the mid-frequency $f_{ctr}$=+/−8%, and PIN_0, PIN_1 at "ON"

FIG. 7 shows a simulation of the scattering parameters (abbreviated as S-parameters) of the switchable of VHF band-pass filter 3 according to FIG. 3 and FIG. 4 for a digital switching signal 38 with the settings PIN_0, PIN_1 at ON. The frequency is plotted in GHz on the horizontal axis 701. The values of the scattering parameters $|S_{11}|$, $|S_{22}|$ and $|S_{22}|$ are plotted in dB on the vertical axis 702. The curve 703 represents the input-end matching of the switchable band-pass filter 3 in the form of the value of the input-reflection factor $|S_{11}|$. The curve 705 represents the output-end matching of the switchable band-pass filter 3 in the form of the value of the output-reflection factor $|S_{22}|$. The switchable band-pass filter 3 is matched for a mid-frequency $f_{ctr}$ of 0.08638 GHz with values for $|S_{11}|$ and $|S_{22}|$ less than −25 dB. The selectivity of the switchable band-pass filter 3 is shown for the illustrated mid-frequency $f_{ctr}$ with the display 706. For a frequency $f_{ctr}$=0.08638 GHz, the value of the filter transmission function 704, 706 and accordingly the insertion loss $|S_{21}|$=−2.829 dB.

In an exemplary embodiment for frequencies in the VHF range based on simulated S-parameters, FIG. 5, FIG. 6 and FIG. 7 show a narrowband band-pass filter 3 capable of being switched over a broad frequency range with high selectivity and low insertion loss. In a further exemplary embodiment, a band-pass filter 3 according to the invention for the UHF range is presented.

Figure 8:
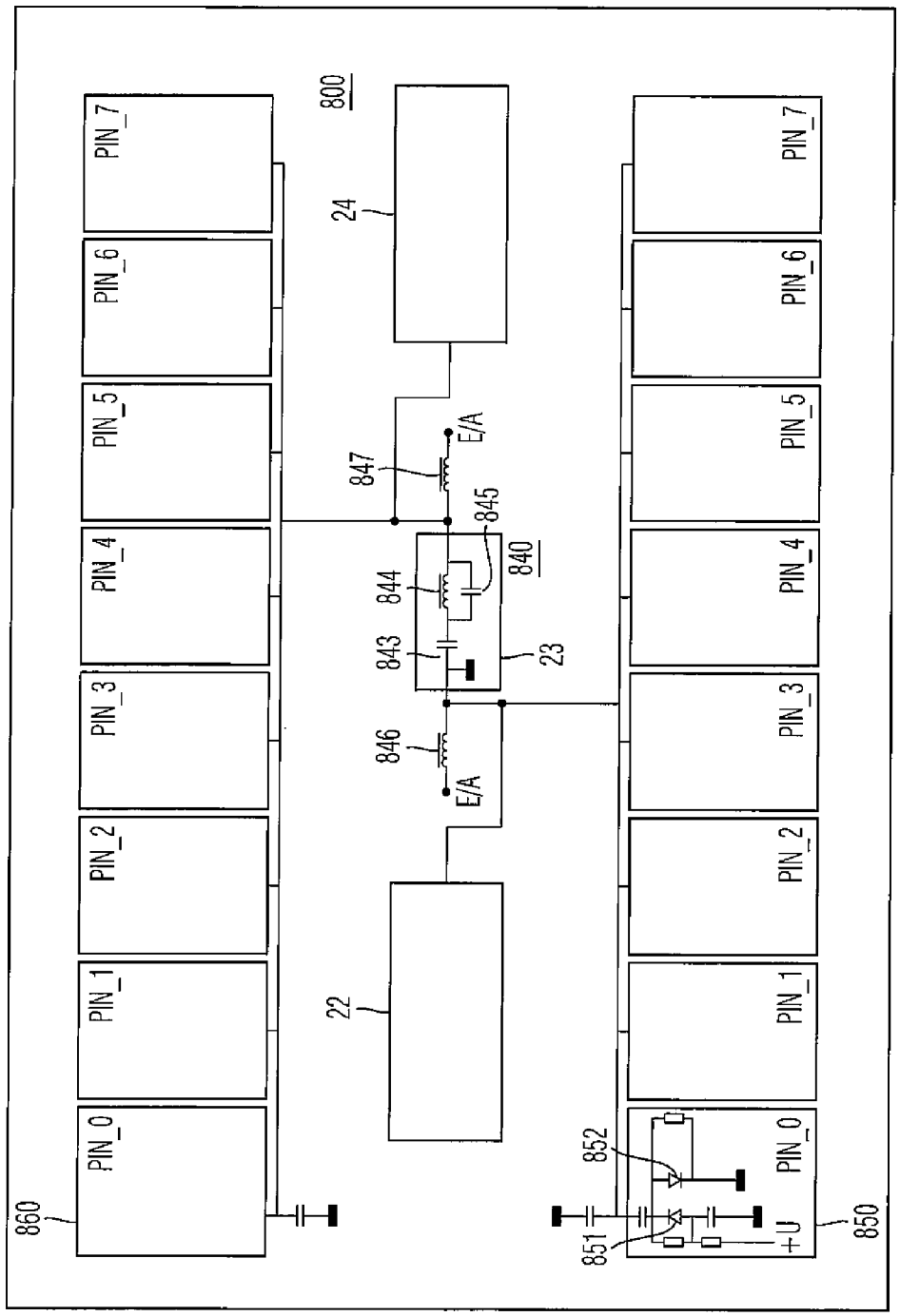
FIG. 8 shows a simple block-circuit diagram of a switchable band-pass filter according to the invention for the UHF range.

FIG. 8 illustrates the structure of the capacitor network 800 as the coupling device 23 determining the frequency of the switchable mid-frequency of the UHF band-pass filter 3, switched via PIN diodes. The capacitor network 800 is structured in a symmetrical manner for the first filter element 22 and the second filter element 24. The inputs and outputs of the band-pass filter marked with reference letters E/A respectively are connected via matching-elements 846 and respectively 847 to the coupling device 23. The matching-elements 846, 847 can comprise a coil or any alternative reactance circuits, as illustrated. Dependent upon the value of the digital switching signal 38, parts of the capacitor network are connected symmetrically and in part to the first filter element 22 and the second filter element 24. Moreover, the coupling device 23 provides a coupling element 840 made up from inductances and capacitors for the fine tuning of the coupling of the first filter element 22 and of the second filter element 24. A switching network 850 for the connection of capacitors is embodied with the PIN diodes 851, 852.

If the digital signal 38 provides the value, PIN_0="ON", an additional capacitor is connected via this switching network 850 to the first filter element 22 and, symmetrically to the latter, a capacitor is connected through the switching network 860 to the second filter element 24. The mid-frequency of the switchable narrowband band-pass filter 3 is varied by connecting the capacitors through the switching network 850, 860. The use according to the invention of PIN diodes as the switching element allows the transmission of relatively large powers across the switchable band-pass filter 3 than could be achieved with the use of varactor diodes. Accordingly, the use of the band-pass filter 3 as a cosite filter is possible.

Figure 9:
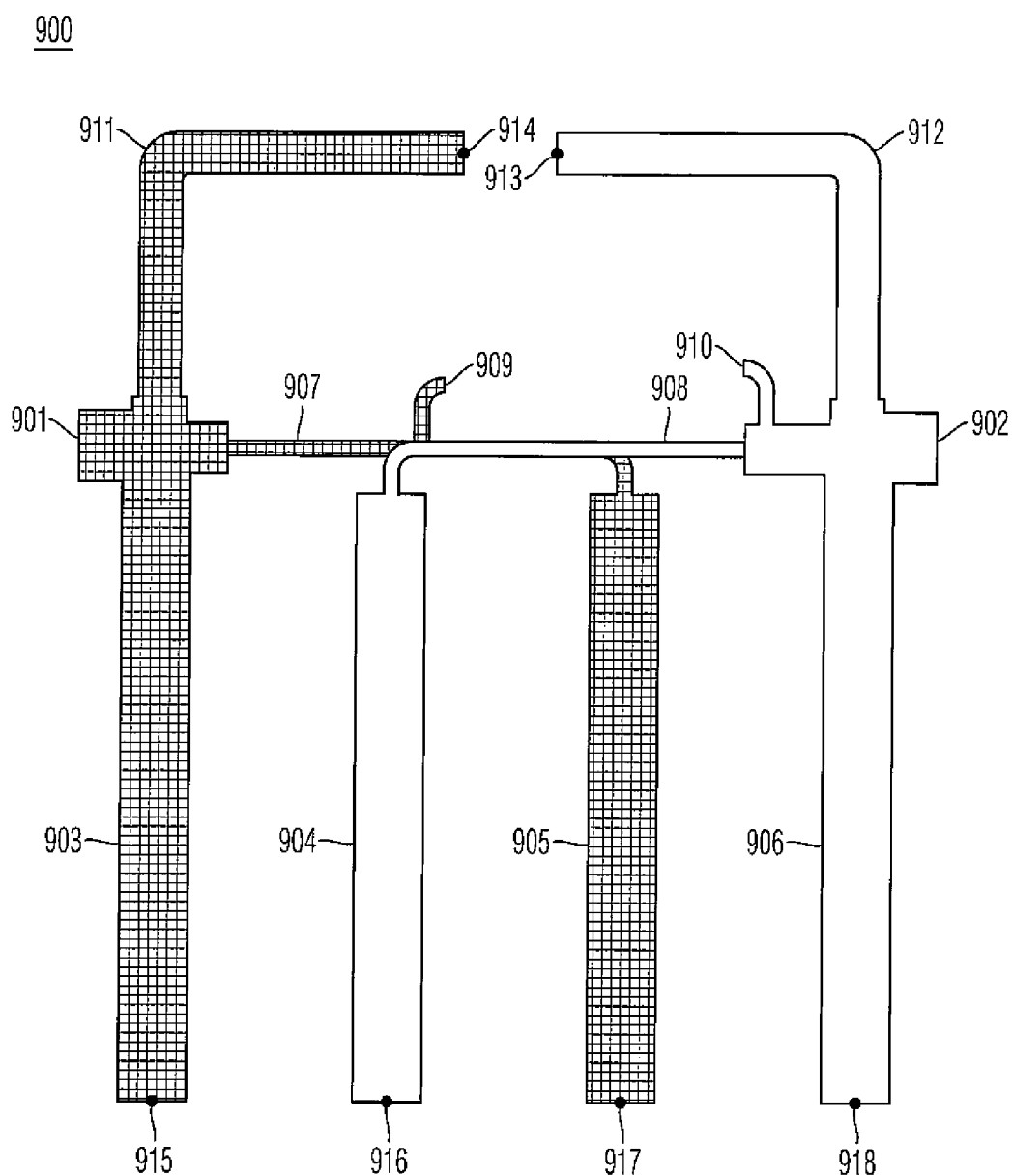
FIG. 9 shows a structure and the arrangement according to the invention of the resonators for a band-pass filter according to the invention for the UHF range.

FIG. 9 shows the structure of the band-pass for an embodiment of the band-pass filter according to the invention for frequencies in the UHF range. The frequency resolution of the switchable band-pass filter 3 in this case is 8 bits, so that a step width for the mid-frequency of 700 kHz is attainable. The overall tuning range of the switchable band-pass filter in the UHF band in the present, second exemplary embodiment extends from 225 MHz to 400 MHz.

In FIG. 9, the first filter element 22 comprises two parallel, straight microstripline portions 903, 905, which are connected to one another via a line portion 907. The microstripline portions 903, 905 are connected to earth at each end via a through contact 915, 917. At the end disposed opposite to the through contact 915, 917, the microstripline portions are connected to one another and to the first connection 901 via the straight-line conductor portion 907 at right angles to the lines 903, 905. Additionally, the first filter element 22 provides an L-shaped microstripline portion 911, which is connected to the first connection 901 of the band-pass filter 3. In the present embodiment, this L-shaped microstripline portion 911 is arranged as an extension of the microstripline portion 903 and, in the present case, is angled through 90° after a given length to form the L-shape. This microstripline portion 911 is used for the calibration of the first filter element. The coupling device 23 comprising a coupling network 23 of PIN diodes and capacitors is additionally connected to the filter element 22 via a line portion 909, which branches off at right angles from the connecting line 907 of the two microstripline portions. The second filter element 24 of the band-pass 24 is structured in a comparable manner to the first filter element 22. The second filter element 24 also comprises two parallel, straight-line microstripline portions 904, 906, which are each shorted at one end 916, 918 and connected via a connecting line 908 formed at right angles to the microstriplines 904, 906. The second filter element 24 further provides an L-shaped microstripline portion 912, which is connected to the output 902 of the band-pass filter 3. This microstripline portion 912 in the present embodiment is arranged as an extension of the first microstripline portion 915 of the second filter element, and, in the present case also, is angled through 90° after a given length. This microstripline portion 912 is used for calibration of the second filter element 24. The coupling device 23 comprising a coupling network 23 of PIN diodes and capacitors is additionally connected to the second filter element 24 via a line portion 910, which branches off at right angles from the connecting line 908 of the two microstriplines 904, 906. The filter elements 22, 24 are arranged with all microstripline portions 903, 905, 904, 906 disposed parallel to one another on different layers of a multi-layered printed-circuit board, in such a manner that the short-circuited ends 915, 916, 917, 918 point in the same direction and are disposed on a straight line perpendicular to the microstripline portions 903, 904, 905, 906 and, at the same time, follow the microstripline portions 903, 905 and 904, 906 of the first and respectively second filter element 22, 24 in alternation with one another. The illustrated arrangement at the same time guarantees a good symmetry of the switchable band-pass filter 3 with reference to the connections 901, 902 and a good, direct electromagnetic coupling between the first filter element 22 and the second filter element 24, at the same time as providing a minimal space requirement for the arrangement. The switchable band-pass filter 3 according to the invention therefore achieves a small structural size of approximately 45 mm×40 mm for the part of the band-pass filter 3 illustrated in FIG. 9 comprising the filter elements 22, 24. The arrangement of the elements on different planes of a multi-plane printed-circuit board is represented by different shading. However, it would also be sufficient to provide only the overlapping connecting lines 907, 908 on different planes. For the housing of the component group of the switchable band-pass filter 3, including the capacitor/PIN diode network 23, overall dimensions of less than 6.6 cm×6 cm×3 cm can be achieved. Accordingly, the second exemplary embodiment of the switchable UHF band-pass filter 3 can be readily integrated into existing device designs, especially for mobile communications devices with small overall dimensions. This can be achieved with an embodiment according to the invention of the filter element 22 and 24 and the coupling according to the invention of the filter element 22, 24. Optimal symmetry of the switchable band-pass filter 3 is achieved by implementing the coupling device 23 determining the frequency by means of PIN diodes, in each case at the high point of the resonators which form the first filter element 22 and the second filter element 24. The printed structure of the resonators of the first filter element 22 and of the second filter element 24 guarantees a good mechanical stability of the band-pass filter 3, which is accordingly designed in a robust manner with regard to vibrations. Additional discrete capacitors C and inductances L in SMD format can be used to vary the coupling of the filter elements 22, 24. The overall component group can be structured on a multi-layer printed-circuit board (for example, 10-layer, manufactured by Rogers) as the substrate. The illustrated design of the band-pass filter 3 according to the invention allows efficient manufacture based on the automatic fitting of SMD technology and re-flow soldering techniques.

Figure 10:
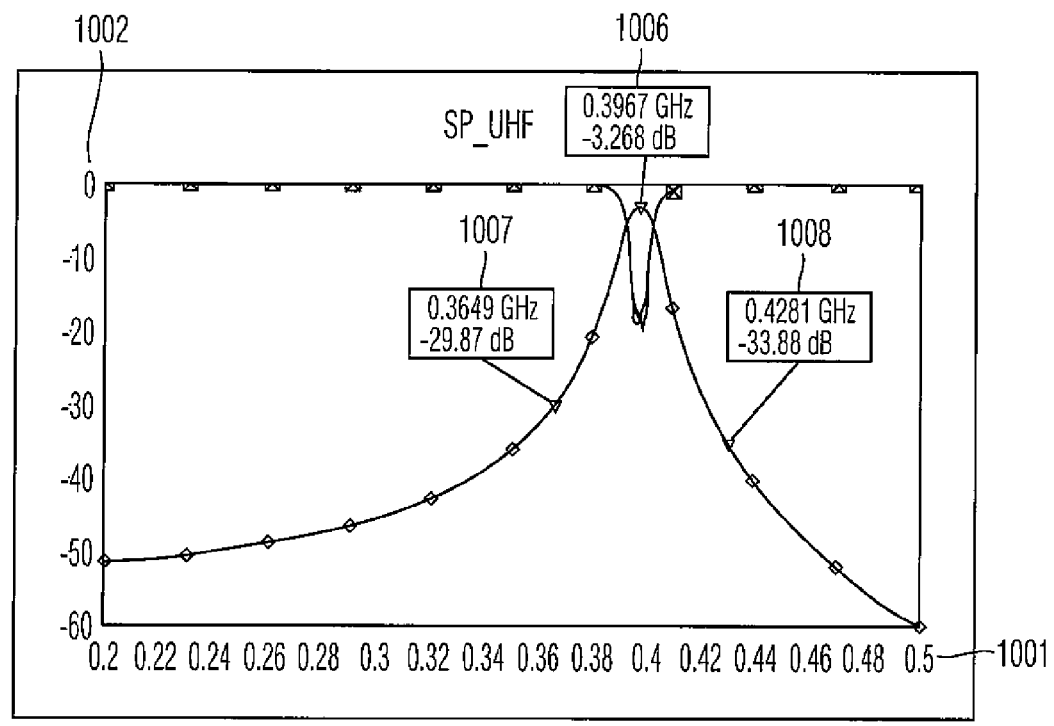
FIG. 10 shows simulated S-parameters for a band-pass filter according to the invention for a deviation from the mid-frequency $f_{ctr}$=+/−8%, and PIN_0, PIN_1, PIN_2 at "ON".

FIG. 10 shows a simulation of the scattering parameters (abbreviated as S-parameters) for the switchable UHF band-pass filter 3 as shown in FIG. 8 and FIG. 9 for a digital switching signal 38 with the settings PIN_0, PIN_1, PIN_2, at "ON". The frequency is plotted in GHz on the horizontal axis 1001. The values of the scattering parameters are plotted in dB on the vertical axis 1002. The curve 1003 represents the input-end matching of the switchable band-pass filter 3 in the form of the value of the input-reflection factor $|S_{11}|$. The curve 1005 represents the output-end matching of the switchable band-pass filter 3 in the form of the value of the output-reflection factor $|S_{22}|$. The switchable band-pass filter 3 is matched for a mid-frequency $f_{ctr}$ of 0.3967 GHz with values for $|S_{11}|$ and $|S_{22}|$ smaller than −15 dB. The selectivity of the switchable band-pass filter 3 is shown for the illustrated mid-frequency $f_{ctr}$ and for frequencies which deviate from $f_{ctr}$. For a frequency $f_{ctr}$=0.3967 GHz, the value of the filter transmission function 1006 and accordingly the insertion loss $|S_{21}|$=−3.266 dB. The loss of the band-pass filter 3 for a frequency of 0.3694 GHz is −29.87 dB 1007 and for a frequency of 0.4281 GHz is −33.88 dB 1008.

The switchable band-pass filter according to the invention is not restricted to the embodiments illustrated. In this context, all of the features of the invention presented can be combined with one another in an appropriate form.

The invention claimed is:

1. A switchable band-pass filter for narrow band filtering over a large frequency band in a co-site filter application, said switchable band-pass filter comprising:
   a first filter element and a second filter element, which are directly coupled to one another via a switchable coupling device,
   wherein the first filter element includes a first connection and the second filter element includes a second connection, wherein the first connection is at least one of a band-pass filter input and a band-pass filter output and the second connection is at least a respective other one of the band-pass filter output and the band-pass filter input,
   wherein the first and the second filter elements each provide a conductor structure formed in a flat plane, which includes respectively at least two line portions, the first and the second filter elements being in direct electromagnetic interaction with one another in at least a part of the at least two line portions extending in a straight line,
   wherein the first and the second filter elements are microstrip lines and each is arranged on a different layer of at least one printed circuit board,
   wherein the at least two line portions of the first and the second filter elements are arranged parallel to one another, such that each line portion of the at least two line portions of the first filter element alternates with each line portion of the at least two line portions of the second filter element,
   wherein the at least two line portions of the first and the second filter elements respectively are each connected at one end in an electrically conductive manner, and
   wherein each of the line portions of the first and the second filter elements is connected at another end with a short circuit to earth and the short circuits are disposed on a straight line which is perpendicular to the line portions.

2. The switchable band-pass filter according to claim 1, wherein the switchable coupling device is realized as a network formed from semi-conductor diodes and capacitors and/or inductances.

3. The switchable band-pass filter according to claim 1, wherein the switchable coupling device comprises varactor diodes or pin diodes.

4. The switchable band-pass filter according to claim 1, wherein the switchable coupling device and control circuits are formed on one or more layers of the at least one printed-circuit board.

5. The switchable band-pass filter according to claim 1, wherein the first and the second connections of the band-pass filter are formed on a part of the first filter element and the second filter element.

6. The switchable band-pass filter according to claim 1, wherein the switchable coupling device is formed in such a manner that capacitors for connection to the first and the second filter elements have a same capacity for the first and the second filter elements.

7. The switchable band-pass filter according to claim 1, wherein the first and the second filter elements are structured in a mutually symmetrical manner.

8. The switchable band-pass filter according to claim 1, wherein the band-pass filter shows symmetrical electrical behavior with reference to the first and the second connections for being operated as a transmission filter and a reception filter, respectively, with identical properties.

9. The switchable band-pass filter according to claim 1, wherein the at least two line portions of the first and the second filter elements each provide a further line portion suitable for tuning a frequency of the band-pass filter.

* * * * *